United States Patent
Wang et al.

(10) Patent No.: US 9,962,916 B2
(45) Date of Patent: May 8, 2018

(54) PACKAGING DEVICE AND PACKAGING METHOD

(71) Applicant: BOE TECHNOLOGY GROUP CO., LTD., Beijing (CN)

(72) Inventors: Wei Wang, Beijing (CN); Zhongyuan Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 178 days.

(21) Appl. No.: 14/908,420

(22) PCT Filed: Aug. 10, 2015

(86) PCT No.: PCT/CN2015/086446
§ 371 (c)(1),
(2) Date: Jan. 28, 2016

(87) PCT Pub. No.: WO2016/123948
PCT Pub. Date: Aug. 11, 2016

(65) Prior Publication Data
US 2016/0368253 A1    Dec. 22, 2016

(30) Foreign Application Priority Data

Feb. 2, 2015 (CN) .......................... 2015 1 0053620

(51) Int. Cl.
*B32B 37/06* (2006.01)
*H01L 33/48* (2010.01)
(Continued)

(52) U.S. Cl.
CPC .............. *B32B 37/06* (2013.01); *B32B 38/18* (2013.01); *B32B 38/1841* (2013.01);
(Continued)

(58) Field of Classification Search
CPC ..... B32B 37/06; B32B 38/18; B32B 38/1841; H01L 33/483; H01L 33/56
See application file for complete search history.

(56) References Cited

U.S. PATENT DOCUMENTS 7,462,028 B2 * 12/2008 Cherala ................. B29C 43/003
                                                           425/385
2012/0160398 A1 * 6/2012 Cheng ..................... B32B 37/10
                                                           156/182
2014/0322827 A1    10/2014 Su

FOREIGN PATENT DOCUMENTS

CN          201776971 U       3/2011
CN          102529284 A       7/2012
(Continued)

OTHER PUBLICATIONS

First Office Action regarding Korean Application No. 10-2016-7031642, dated Jun. 1, 2017. Translation provided by Dragon Intellectual Property Law Firm.
(Continued)

*Primary Examiner* — Daniel McNally
(74) *Attorney, Agent, or Firm* — Harness, Dickey & Pierce, P.L.C.

(57) ABSTRACT

The present disclosure relates to a packaging device and a packaging method. The packaging device includes a first platform and a second platform facing the first platform. The first platform moves back and forth towards or away from the second platform. The first platform is provided with a first electromagnetic device. The packaging device further includes at least one patch which is capable of being adsorbed by the first electromagnetic device. One side of the patch is attached to the first platform, and the other side of the patch is configured to be attached to a substrate to be packaged. The substrate is detachably fixed onto the first platform.

14 Claims, 3 Drawing Sheets

(51) Int. Cl.
*H01L 33/56* (2010.01)
*B32B 38/18* (2006.01)
*H01L 51/52* (2006.01)
*B32B 37/10* (2006.01)
*B32B 37/12* (2006.01)

(52) U.S. Cl.
CPC ............ *H01L 33/483* (2013.01); *H01L 33/56* (2013.01); *H01L 51/524* (2013.01); *B32B 37/1018* (2013.01); *B32B 37/12* (2013.01); *B32B 38/1858* (2013.01); *B32B 2309/68* (2013.01); *B32B 2310/0806* (2013.01); *B32B 2315/08* (2013.01); *B32B 2457/00* (2013.01); *B32B 2457/20* (2013.01)

(56) References Cited

FOREIGN PATENT DOCUMENTS

| | | |
|---|---|---|
| CN | 203566387 U | 4/2014 |
| CN | 103872264 A | 6/2014 |
| CN | 203910867 U | 10/2014 |
| CN | 104339813 A | 2/2015 |
| CN | 104637843 A | 5/2015 |
| JP | 2007324347 A | 12/2007 |
| KR | 20120083686 | 7/2012 |
| KR | 20130078796 | 7/2013 |
| WO | WO-2014025120 A1 | 2/2014 |

OTHER PUBLICATIONS

First Office Action regarding Chinese application No. 201510053620.6, dated Nov. 28, 2016. Translation provided by Dragon Intellectual Property Law Firm.

International Search Report and Written Opinion of the International Searching Authority for international application No. PCT/CN2015/086446, dated Aug. 10, 2015.

Second Office Action regarding Chinese Application No. 201510053620.6, dated Aug. 2, 2017. Translation provided by Dragon Intellectual Property Law Firm.

* cited by examiner

PACKAGING DEVICE AND PACKAGING METHOD

CROSS REFERENCE OF RELATED APPLICATIONS

The present application is the U.S. national phase of PCT Application No. PCT/CN2015/086446 filed on Aug. 10, 2015, which claims a priority of Chinese patent application No. 201510053620.6 filed on Feb. 2, 2015, the disclosures of both of which are incorporated herein by reference in theft entirety.

TECHNICAL FIELD

The present disclosure relates to the technical field of manufacturing display devices, and in particular to a packaging device and a packing method.

BACKGROUND

Conventionally, a Light Emitter Diode (LED) display panel is mainly packaged by glass packaging material (for example, ultraviolet (UV) glue). During the packaging, a cover glass and a substrate glass are adsorbed and aligned, and then the UV glue between the substrate glass and the cover glass is irradiated by UV light, so as to package the cover glass and the substrate glass together by the UV glue.

There are mainly two kinds of absorption methods including vacuum absorption and electrostatic absorption in the prior art. If the glass is adsorbed by the vacuum absorption method, the adsorbed glass may easily fall in condition that a chamber for the operation is in a high vacuum. Therefore the vacuum absorption method is inapplicable for the packaging in the high vacuum condition. Furthermore, upon releasing the adsorbed glass substrate, the glass substrate may be vibrated due to switching on/off a pressure-vent hole, and thus the glass substrate may be offset, which adversely affects a precision of the alignment.

For the electrostatic absorption method, an appropriate electrostatic range has to be determined based on the type of one substrate. If the static electricity is excessive, it may cause problems such as breakdown of the LED device; and if the static electricity is insufficient, the substrate may easily fall, the precision of the alignment may be adversely affected, and the process is complicated. Furthermore, since one component to be packaged is needed to be irradiated by the UV light from the bottom of the component, thus it is difficult to configure one static absorption device with vacuum absorption function. As a result, the absorption strength is low and the substrate may fall.

SUMMARY

An object of the present disclosure is to provide a packaging device and a packaging method, which can package components in a high vacuum condition.

For solving the above technical problem, in one aspect of the present disclosure, a packaging device is provided and includes a first platform and a second platform facing the first platform. The first platform is configured to move back and forth towards or away from the second platform. The first platform is provided with a first electromagnetic device. The packaging device further includes at least one patch which is capable of being adsorbed by the first electromagnetic device. When the patch is adsorbed by the first electromagnetic device, one side of the patch is attached to the first platform, and the other side of the patch is configured to be attached to a substrate to be packaged.

Optionally, the patch is a magnetic patch.

Optionally, the first platform is further provided with at least one vacuum adsorption hole defined therein; the vacuum adsorption hole is configured to fix the substrate to be packaged on the first platform via adsorption.

Optionally, the vacuum adsorption hole has an end surface having a shape of square wave or a shape of Chinese word "回".

Optionally, the second platform is provided with a second electromagnetic device at a position corresponding to the first electromagnetic device; the magnetic patch is capable of being adsorbed by the second electromagnetic device.

Optionally, the first electromagnetic device includes a plurality of electromagnetic induction coils; the electromagnetic induction coils are arranged on at least two opposite sides of the first platform.

Optionally, the magnetic patch includes a magnetic body and ultraviolet (UV) separation glue arranged on the magnetic body; the UV separation glue is configured to be attached to the substrate to be packaged.

Optionally, the first platform is further provided with a recess; the magnetic patch is arranged in the recess; a depth of the recess is not greater than a thickness of the magnetic patch.

Optionally, the packaging device further includes a compressible spacer arranged in the recess; wherein the compressible spacer is in contact with the magnetic patch.

Optionally, the packaging device further includes a carrier reel which is wound with a carrier tape; wherein the magnetic patch is detachably arranged on the carrier tape; when the carrier reel rotates relative to the second platform, the carrier tape wound on the carrier reel is laid on the second platform, and the magnetic patch is arranged on a surface of the carrier tape towards the first platform; when the first platform moves towards the second platform, the magnetic patch is adsorbed by the first electromagnetic device and attached to the first platform.

Optionally, the magnetic patch is detachably arranged on the carrier tape by the UV separation glue.

Optionally, the packaging device further includes a tape retracting reel; wherein the tape retracting reel is configured to retract the empty carrier tape after completion of packaging.

Optionally, the packaging device further includes an adjusting part arranged on a side of the first platform away from the second platform, and a driving device connected to the adjusting part; wherein the adjusting part is configured to adjust a relative position of the first platform to the second platform.

In another aspect of the present disclosure, a packaging method by using the above packaging device is provided and includes steps of:

activating the first electromagnetic device on the first platform, to cause the patch to be attached to the first platform;

placing the first substrate on the second platform, and causing the first platform to move towards the second platform until the patch is in contact with the first substrate and the first substrate is fixed on the first platform;

causing the first platform to move away from the second platform, placing the second substrate on the second platform, and vacuum pumping a chamber;

causing the first platform to move towards the second platform, and adjusting a position of the first platform to align the first substrate with the second substrate;

deactivating the first electromagnetic device to release the first substrate, so as to cause the first substrate to be jointed with the second substrate; and restoring a pressure of the chamber to the atmospheric pressure, and irradiating the packaging material to cure the packaging material, so as to complete the packaging of the first substrate and the second substrate.

Optionally, the first platform is provided with at least one vacuum adsorption hole defined therein; the first substrate is fixed on the first platform by the vacuum adsorption hole via adsorption.

Optionally, the second platform is provided with a second electromagnetic device at a position corresponding to the first electromagnetic device; the magnetic patch is capable of being adsorbed by the second electromagnetic device; before deactivating the first electromagnetic device, the method further includes a step of activating the second electromagnetic device.

In the present disclosure, the magnetic patch is attached to the substrate, and adsorbed by the electromagnetic device, so that the substrate is adsorbed and may not fall in high vacuum condition. When aligning and jointing, a magnetic device on the first platform is deactivated while the other magnetic device on the second platform is activated, so that the substrate may be released accurately without offset, and thus the alignment precision is improved.

BRIEF DESCRIPTION OF THE DRAWINGS

The drawings are illustrated to present the present disclosure in a clearer manner in association with the following embodiments, and form a portion of the present disclosure. The present disclosure is not limited thereto.

In drawings, 1—first platform; 2—second platform; 11—first electromagnetic device; 12—vacuum adsorption hole; 13—recess; 14—adjusting pad; 21—second electromagnetic device; 22—quartz glass; 3—magnetic patch; 31—magnetic body; 32—UV separation glue; 4—carrier reel; 5—carrier tape; 6—tape retracting reel; 7—adjusting part; 8—first substrate; and 9—second substrate.

DETAILED DESCRIPTION

The present disclosure will be described hereinafter in conjunction with the drawings and embodiments. It should be noted that the following embodiments are for illustrative purposes only, but shall not be used to limit the scope of the present disclosure.

Figure 1:
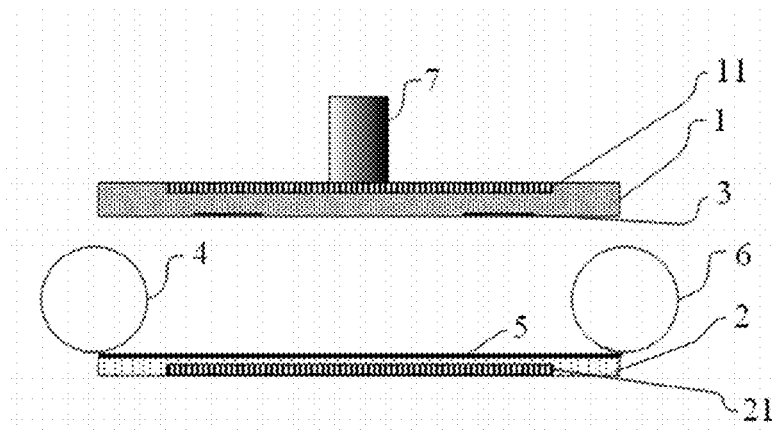
FIG. 1 is a schematic view of a packaging device according to one embodiment of the present disclosure.

The present disclosure provides a packaging device. As illustrated in FIG. 1, the packaging device includes a first platform 1 and a second platform 2 facing the first platform 1. The first platform 1 is configured to move back and forth towards or away from the second platform 2. The first platform 1 is provided with a first electromagnetic device 11. The packaging device further includes at least one magnetic patch 3 which is capable of being adsorbed by the first electromagnetic device 11. One side of the magnetic patch 3 is attached to the first platform 1, and the other side of the magnetic patch 3 is capable of being attached to a substrate to be packaged. The substrate is detachably fixed to the first platform 1.

The present disclosure may be applicable to package a first substrate (for example, a cover glass) and a second substrate (for example, a substrate glass) of an organic LED (OLED) display panel. The first platform 1 is configured to adsorb the first substrate, and the second platform 2 is configured to hold the second substrate. In this embodiment, the magnetic patch 3 is attached to the first substrate, and the first electromagnetic device 11 is arranged on the first platform 1. When being powered on, the first electromagnetic device 11 generates magnetic force and adsorbs the magnetic patch 3. The presence of the magnetic patch 3 can ensure that the first substrate is adsorbed and may not fall down in the high vacuum condition. When being powered off, the magnetic force disappears, then the first substrate may be properly released so as to be aligned and packaged with the second substrate.

Furthermore, the device may not be vibrated when the first electromagnetic device 11 is switched on/off, thereby avoiding potential offset of the first substrate when being released and then ensuring the alignment precision.

Figure 2:
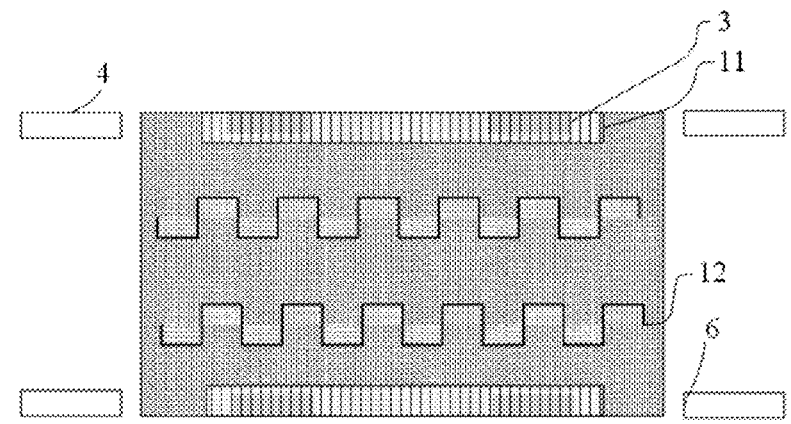
FIG. 2 is a schematic plan view of a first platform according to one embodiment of the present disclosure.

Furthermore, as illustrated in FIG. 2, the first platform 1 is provided with at least one vacuum adsorption hole 12. The vacuum adsorption hole 12 is configured to fix the substrate to be packaged onto the first platform 1 via adsorption. In other words, as an implementation, the substrate may be detachably fixed onto the first platform 1 by the vacuum absorption as well as the magnetic absorption.

For example, when packaging the first substrate and the second substrate of the OLED display panel, after the first platform 1 adsorbs the first substrate, the first platform 1 moves towards the second substrate placed on the second platform 2. At this point, a chamber is vacuum pumped, so that the first substrate and the second substrate are aligned and jointed in the vacuum condition. The first substrate may not fall due to the presence of the magnetic patch 3. After the first substrate and the second substrate are jointed together, the chamber is inflated to the atmospheric pressure, and the first substrate and the second substrate may be further pressed together due to an air pressure difference between the outside and the inside of the two substrates. Then, the glass packaging material arranged between the two substrates is irradiated by laser, so that the packaging process is fulfilled.

In particular, after the first substrate is adsorbed and before the first substrate is moved towards the second substrate, as illustrated in FIG. 2, an end surface of the vacuum adsorption hole 12 is arranged to be in a shape of square wave, so as to improve the strength and uniformity of the vacuum absorption applied to the first substrate by the first platform 1. It is noted that the present disclosure is not limited to the above example, and the end surface of the vacuum adsorption hole 12 may be alternatively arranged to be in a shape other than the square wave, for example the shape of Chinese word "回", as long as the vacuum absorption may be achieved.

Figure 3:
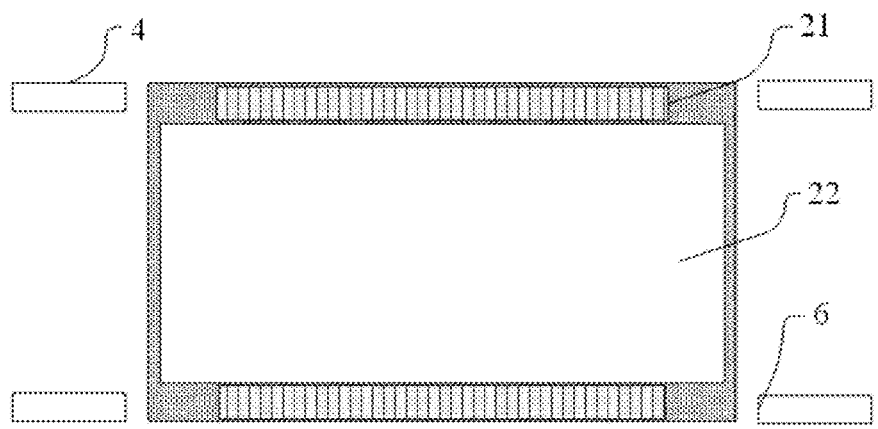
FIG. 3 is a schematic plan view of a second platform according to one embodiment of the present disclosure.

Furthermore, as illustrated in FIG. 3, the second platform 2 is provided with a second electromagnetic device 21 at a position corresponding to the first electromagnetic device 11. The magnetic patch 3 is capable of being adsorbed by the second electromagnetic device 21.

For example, when packaging the first substrate and the second substrate of the OLED display panel, after the first substrate is close to and accurately aligned with the second substrate, the first substrate is released to be jointed with the second substrate. Since the chamber is vacuum pumped, thus the vacuum absorption capability of the first platform 1 disappears. At this point, it only needs to turn off the power to cause the magnetic force of the first electromagnetic device 11 to disappear. In this embodiment, since the second electromagnetic device 21 is arranged on the second platform 2 at the position corresponding to the first electromagnetic device 11, thus, in order to avoid the potential offset of the first substrate when being released, the second electromagnetic device 21 may be first powered on, and then the first electromagnetic device 11 may be powered off, so as to keep the magnetic patch 3 in the state of being adsorbed. As a result, the potential offset of the first substrate upon being released is avoided, and the precision of the alignment and packaging is improved.

In particular, as illustrated in FIGS. 2 and 3, the first electromagnetic device 11 includes a plurality of electromagnetic induction coils. The electromagnetic induction coils are arranged on at least two opposite sides of the first platform 1. Accordingly, the second electromagnetic device 21 also includes a plurality of electromagnetic induction coils. Positions of the electromagnetic induction coils on the second platform 2 are corresponding to positions of the electromagnetic induction coils on the first platform 1, respectively.

Materials of the first platform 1 and the second platform 2 are not limited in the present disclosure. For example, a base of the second platform 2 may be made of quartz glass 22. The second electromagnetic device 21 may be arranged around the quartz glass 22, as illustrated in FIG. 3.

Figure 4:
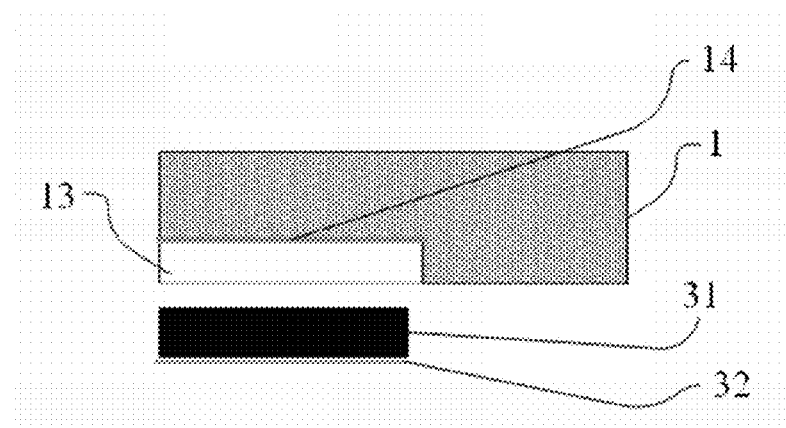
FIG. 4 is a schematic view showing a situation where a magnetic patch is fitted to the first platform according to one embodiment of the present disclosure.

In the present disclosure, the magnetic patch 3 may be made of iron. As illustrated in FIG. 4, the magnetic patch 3 includes a magnetic body 31 and UV separation glue 32 arranged on the magnetic body 31. The UV separation glue 32 is configured to be attached with the substrate to be packaged.

Furthermore, a recess 13 is defined in the first platform 1 at a position where the magnetic patch 3 is attached, so that the magnetic patch 3 can be arranged in the recess 13. A depth of the recess 3 is not greater than a thickness of the magnetic patch 3, so as to ensure that the magnetic patch 3 is capable of being attached to the substrate to be packaged. The presence of the recess 13 can reduce a distance between the vacuum adsorption hole 12 and the substrate, thereby ensuring the vacuum absorption effect.

A compressible spacer 14 may be arranged in the recess 13. The compressible spacer 14 is configured to be in contact with the magnetic patch 3, to prevent an adsorbed part of the substrate from deformation.

Moreover, as illustrated in FIG. 1, the packaging device may further include a carrier reel 4 which is wound with carrier tape 5. The magnetic patch 3 is detachably arranged on the carrier tape 5. When the carrier reel 4 rotates and moves on the second platform 2, the carrier tape 5 is laid on the second platform 2 with the magnetic patch 3 on a surface which is of the carrier tape 5 and faces the first platform 1. When the first platform 1 moves towards the second platform 2, the magnetic patch 3 is adsorbed by the first electromagnetic device 11 and is attached to the first platform 1.

In particular, the magnetic patch 3 is detachably arranged on the carrier tape 5 by UV separation glue 32. Furthermore, the packaging device further includes a tape retracting reel 6. The tape retracting reel 6 is configured to retract the empty carrier tape 5 after completion of packaging.

Moreover, the packaging device further includes an adjusting part 7, arranged on a side which is of the first platform 1 and is away from the second platform 2. The adjusting part 7 is connected to a driving device, and configured to adjust a relative position of the first platform 1 to the second platform 2. Herein, the relative position includes a vertical distance, a horizontal distance, a degree of parallelization, etc. between the two substrates.

The present disclosure further provides a packaging method adopting the above packaging device. The packaging method is to package a first substrate and a second substrate with packaging material arranged on the first substrate or the second substrate. The packaging method includes steps of:

activating the first electromagnetic device on the first platform, so as to cause the magnetic patch to be attached to the first platform;

placing the first substrate on the second platform, and causing the first platform to move towards the second platform until the magnetic patch is attached to the first substrate and the first substrate is fixed on the first platform;

causing the first platform to move away from the second platform, placing the second substrate on the second platform, and vacuum pumping a chamber;

causing the first platform to move towards the second platform, and adjusting a position of the first platform to align the first substrate with the second substrate;

deactivating the first electromagnetic device to release the first substrate, so as to joint the first substrate and the second substrate; and restoring a pressure of the chamber to the atmospheric pressure, and irradiating the packaging material to cause the packaging material to be melted and then solidified, so as to complete the packaging of the first substrate and the second substrate.

In the embodiment as illustrated above, it is ensured that the first substrate can be adsorbed and is not fall down in the high vacuum condition. When powered off, the magnetic force disappears, and the first substrate may be properly released to be aligned and packaged with the second substrate. Furthermore, the device may not be vibrated when the first electromagnetic device 11 is switched on/off, so as to avoid the potential offset of the first substrate when being released, and ensure the alignment precision.

Furthermore, at least one vacuum adsorption hole is defined in the first platform. The first substrate is fixed onto the first platform by the vacuum adsorption hole via adsorption.

Furthermore, a second electromagnetic device is arranged on the second platform at a position corresponding to the first electromagnetic device. The magnetic patch is capable of being adsorbed by the second electromagnetic device.

The method further includes a step of activating the second electromagnetic device before deactivating the first electromagnetic device.

In the present disclosure, the magnetic patch is attached to the substrate, and adsorbed by the magnetic device, so that the substrate is adsorbed in high vacuum condition and is not fall via the vacuum absorption as well as the magnetic absorption. When aligning and jointing, the magnetic device on the first platform is deactivated while the other magnetic device on the second platform is activated, so that the substrate may be released with a proper orientation without offset, and thus the alignment precision is improved.

Figure 5A:
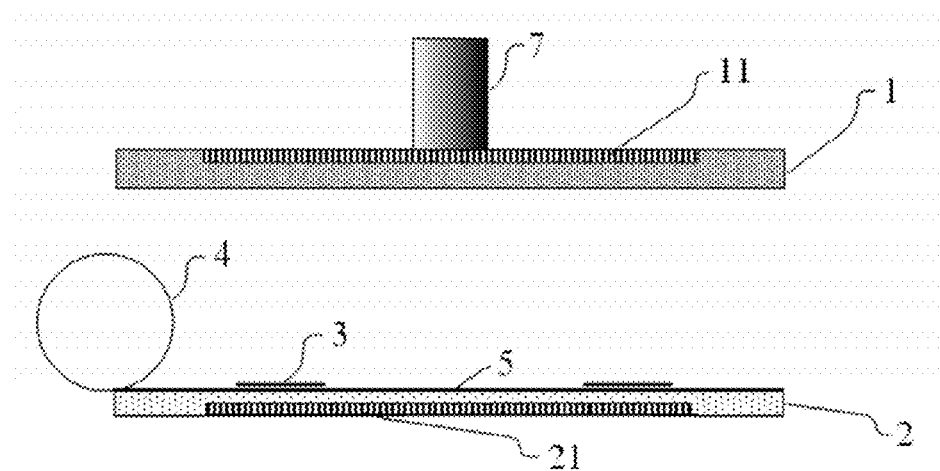
FIGS. 5a-5e are schematic flow chart of a packaging method according to one embodiment of the present disclosure.
Figure 5B:
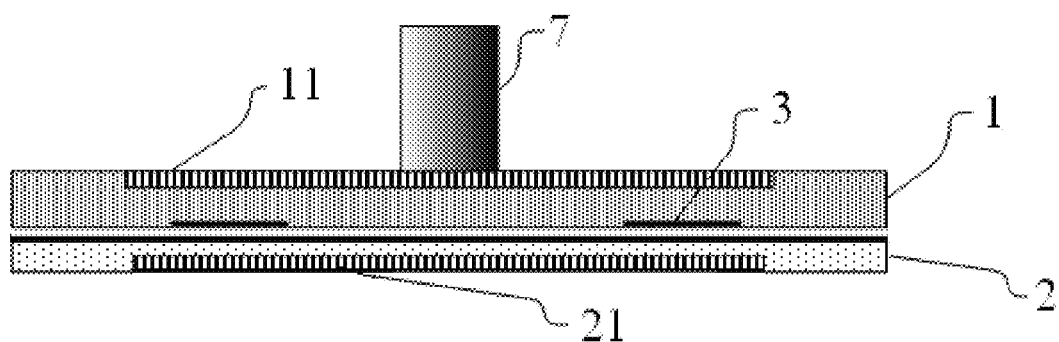
Figure 5C:
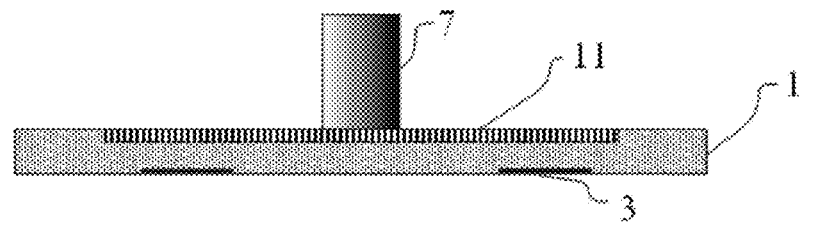
Figure 5D:
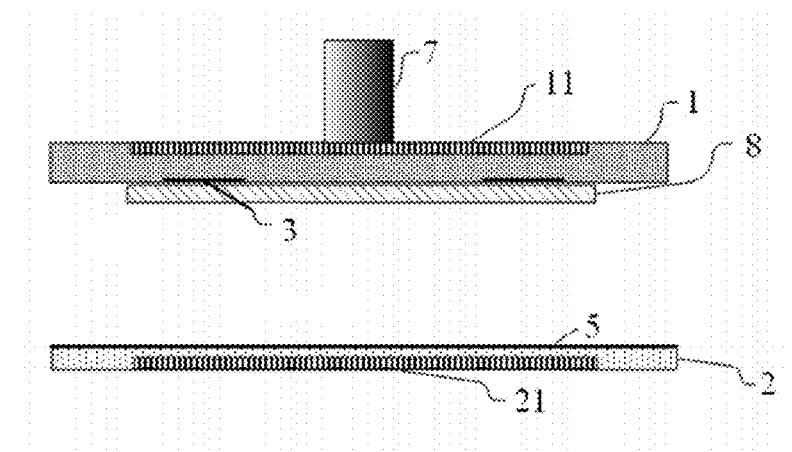
Figure 5E:
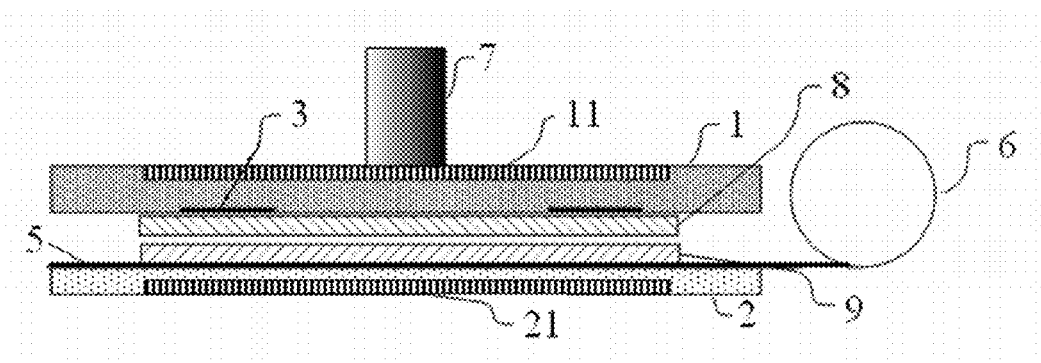

In the following, the present disclosure will be further explained in association with the embodiment as illustrated in FIGS. 5a-5e. The packaging process includes steps of:

rotating the carrier wheel 4 to lay the carrier tape 5 with the magnetic patch 3 being arranged onto the second platform 2, as illustrated in FIG. 5a;

causing the first platform 1 to move downwardly, until being in contact with the magnetic patch 3; and activating the first electromagnetic device 11 to cause the magnetic patch 3 to be adsorbed onto the first platform 1, as illustrated in FIG. 5b;

causing the first platform 1 to move upwardly and waiting for the first substrate to be inputted into the device, as illustrated in FIG. 5c;

inputting the first substrate 8 into the device; causing the first platform 1 to move towards the first substrate 8; and activating the vacuum absorption function to adsorb the first substrate 8 onto the first platform 1 while adhering the first substrate 8 to a side of the magnetic patch 3 on which the UV separation glue 32 is arranged, as illustrated in FIG. 5d; and inputting the second substrate 9 into the device; starting to vacuum pump the chamber; precisely aligning the first substrate 8 with the second substrate 9 by the adjusting part 7; after the alignment, activating the second electromagnetic device 21 and deactivating the first electromagnetic device 11 to release the first substrate 8, so as to ensure that first substrate 8 is not offset when being released; inflating the chamber to the atmospheric pressure; irradiating UV light to the glass packaging material between the first substrate 8 and the second substrate 9 so as to sure the glass packaging material, thereby completing the packaging, as illustrated in FIG. 5e.

It is noted that during the radiation, the magnetic patch 3 may be separated from the first substrate 8, so as to disassemble the magnetic patch 3.

In the present disclosure, not only the substrates are aligned and packaged in the vacuum condition, but also the precision of the alignment and the packaging is improved. Furthermore, the device may not be vibrated when the electromagnetic device is switched on/off, so as to prevent the substrate from being offset which otherwise might be caused by the vibration of the device, and ensure that the alignment precision.

The above are merely the preferred embodiments of the present disclosure. It should be noted that, a person skilled in the art may make further improvements and modifications without departing from the principle of the present disclosure, and these improvements and modifications shall also fall within the scope of the present disclosure.

What is claimed is:

1. A packaging device, comprising:
a first platform and a second platform facing the first platform;
wherein the first platform is configured to move back and forth towards or away from the second platform; the first platform is provided with a first electromagnetic device;
wherein the packaging device further comprises at least one patch which is capable of being adsorbed by the first electromagnetic device;
when the patch is adsorbed by the first electromagnetic device, one side of the patch is attached to the first platform, and the other side of the patch is configured to be attached to a substrate to be packaged;
wherein the patch is a magnetic patch;
wherein the magnetic patch comprises a magnetic body and ultraviolet (UV) separation glue arranged on the magnetic body; the UV separation glue is configured to be attached to the substrate to be packaged.

2. The packaging device according to claim 1, wherein the first platform is further provided with at least one vacuum adsorption hole defined therein; the vacuum adsorption hole is configured to fix the substrate to be packaged on the first platform via adsorption.

3. The packaging device according to claim 2, wherein the vacuum adsorption hole has an end surface having a shape of square wave or a shape of Chinese word "回".

4. The packaging device according to claim 1, wherein the second platform is provided with a second electromagnetic device at a position corresponding to the first electromagnetic device; the magnetic patch is capable of being adsorbed by the second electromagnetic device.

5. The packaging device according to claim 4, wherein the first electromagnetic device comprises a plurality of electromagnetic induction coils; the electromagnetic induction coils are arranged on at least two opposite sides of the first platform.

6. The packaging device according to claim 1, wherein the first platform is further provided with a recess; the magnetic patch is arranged in the recess; a depth of the recess is not greater than a thickness of the magnetic patch.

7. The packaging device according to claim 6, further comprising a compressible spacer arranged in the recess; wherein the compressible spacer is in contact with the magnetic patch.

8. A packaging device, comprising: a first platform and a second platform facing the first platform;
wherein the first platform is configured to move back and forth towards or away from the second platform; the first platform is provided with a first electromagnetic device;
wherein the packaging device further comprises at least one patch which is capable of being adsorbed by the first electromagnetic device;
when the patch is adsorbed by the first electromagnetic device, one side of the patch is attached to the first platform, and the other side of the patch is configured to be attached to a substrate to be packaged;
wherein the patch is a magnetic patch;
wherein the packaging device further comprises a carrier reel which is wound with a carrier tape; wherein the magnetic patch is detachably arranged on the carrier tape;
when the carrier reel rotates relative to the second platform, the carrier tape wound on the carrier reel is laid on the second platform, and the magnetic patch is arranged on a surface of the carrier tape towards the first platform;
when the first platform moves towards the second platform, the magnetic patch is adsorbed by the first electromagnetic device and attached to the first platform.

9. The packaging device according to claim 8, wherein the magnetic patch is detachably arranged on the carrier tape by the UV separation glue.

10. The packaging device according to claim 8, further comprising a tape retracting reel; wherein the tape retracting reel is configured to retract the empty carrier tape after completion of packaging.

11. The packaging device according to claim 8, further comprising an adjusting part arranged on a side of the first platform away from the second platform, and a driving device connected to the adjusting part;

wherein the adjusting part is configured to adjust a relative position of the first platform to the second platform.

12. A packaging method for using a packaging device to package a first substrate and a second substrate with packaging material arranged on the first substrate or the second substrate;
   wherein the packaging device comprises a first platform and a second platform facing the first platform; wherein the first platform is configured to move back and forth towards or away from the second platform; the first platform is provided with a first electromagnetic device; wherein the packaging device further comprises at least one patch which is capable of being adsorbed by the first electromagnetic device; when the patch is adsorbed by the first electromagnetic device, one side of the patch is attached to the first platform, and the other side of the patch is configured to be attached to a substrate to be packaged;
   wherein the method comprises steps of:
   activating the first electromagnetic device on the first platform, to cause the patch to be attached to the first platform;
   placing the first substrate on the second platform, and causing the first platform to move towards the second platform until the patch is in contact with the first substrate and the first substrate is fixed on the first platform;
   causing the first platform to move away from the second platform, placing the second substrate on the second platform, and vacuum pumping a chamber;
   causing the first platform to move towards the second platform, and adjusting a position of the first platform to align the first substrate with the second substrate;
   deactivating the first electromagnetic device to release the first substrate, so as to cause the first substrate to be jointed with the second substrate; and
   restoring a pressure of the chamber to the atmospheric pressure, and irradiating the packaging material to cure the packaging material, so as to complete the packaging of the first substrate and the second substrate.

13. The method according to claim 12, wherein the first platform is provided with at least one vacuum adsorption hole defined therein; the first substrate is fixed on the first platform by the vacuum adsorption hole via adsorption.

14. The method according to claim 13, wherein the second platform is provided with a second electromagnetic device at a position corresponding to the first electromagnetic device; the magnetic patch is capable of being adsorbed by the second electromagnetic device;
   before deactivating the first electromagnetic device, the method further comprises a step of activating the second electromagnetic device.

* * * * *